United States Patent

[11] 3,617,825

[72] Inventors George E. Chilton
Haworth; Karabet Simonyan,
Saddle Brook, N.J.
[21] Appl. No. 785,927
[22] Filed Dec. 23, 1968
[45] Patented Nov. 2, 1971
[73] Assignee Computer Diode Corporation, Fair Lawn, N.J.

[54] MULTIJUNCTION PHOTODIODE DETECTOR

1 Claim, 5 Drawing Figs.

[52] U.S. Cl. .......... 317/234, 317/235 N, 317/234 W, 250/211
[51] Int. Cl. .......... H01l 15/00
[50] Field of Search .......... 317/234 (11), 235 (27); 250/211 J, 212

[56] References Cited
UNITED STATES PATENTS

| | | | |
|---|---|---|---|
| 3,518,438 | 6/1968 | Hart et al. | 250/211 |
| 3,422,527 | 1/1969 | Gault | 29/572 |
| 3,274,454 | 9/1966 | Haberecht | 317/234 |

*Primary Examiner*—John W. Huckert
*Assistant Examiner*—Martin H. Edlow
*Attorney*—Darby & Darby

ABSTRACT: A stack of semiconductors are arranged with the edge of the junctions exposed to a source of light whose intensity is to be measured. There is a resulting output voltage which is virtually independent of the exposed area. This characteristic permits high-output devices of small size.

GEORGE E. CHILTON
KARABET SIMONYAN
INVENTOR.

BY Leonard H. King
ATTORNEY

MULTIJUNCTION PHOTODIODE DETECTOR

This invention relates to photosensitive devices and in particular, multijunction photovoltaic devices.

BACKGROUND OF THE INVENTION

In general, the prior art light intensity measuring devices depend on extrinsic measurements of a related parameter. For example, the photoresistive device relies on a change in resistance related to changes in intensity of the light to which the device is subject. The change in resistance in turn produces a change in current which change is measured by an ammeter to provide a reading which is indicative of the light intensity, or is detected and the resulting signal used to trigger "on-off" devices. The device of this invention provides a voltage output which is a function of the intensity of the light impinging on the device.

The invention may be better appreciated by a consideration of some of the principal prior art photoresponsive devices and some of their limitations, which are as follows:

1. Photoemissive devices, e.g., vacuum and gas filled photo tubes. Such devices have limitations in that they are large, fragile, volatile, and are affected by environmental conditions.

2. Photocurrent generators, e.g., solar cells, PN junctions, etc. Limitations include the fact that current output is not only a function of the intensity of the light, but also of the efficiency of the converter, and the surface area of the sensor subject to the light.

3. Photoresistive devices, e.g., cadmium sulfide The output is a function of light intensity, area of exposure and past illumination history. This past illumination memory characteristic is disadvantageous.

4. Prior art photovoltaic devices were essentially low voltage devices, e.g., selenium photocells. These devices could not directly trigger utilization devices requiring a particular signal level for actuation. Such devices have a theoretical function determined by the gap energy of the material used to form the PN junctions. A large sensor area is necessary to provide sufficient power to actuate even a sensitive D' Arsonval meter movement.

5. Photomultipliers. A major problem in instrumentation employing light-responsive sensing devices is the obtaining of adequate signal output. When the signal output of a conventional device is amplified, the random noise is likewise amplified in proportion. To overcome this deficiency, such devices as photomultipliers are frequently cooled by cryogenic means to reduce the inherent noise.

6. Phototransistors. The gain of a phototransistor depends on the geometry of the device and also on the external circuitry of the transistor amplifier.

In contrast to photoresistive devices and certain other devices where the area of the device illuminated determines such parameters as conductivity, the present device relies on the presence of light at the junction to generate an electropotential. The potential generated is virtually independent of the area of the junction. This may be appreciated by considering the action of an electrochemical cell where the output is a function of the electropotential difference between the electrodes and is independent of the electrode area. If a number of electrochemical cells are connected in series, a higher output voltage is obtained. Likewise greater sensitivity may be obtained by connecting a number of photodiode junctions in series. There is also an improvement in the signal-to-noise ratio since the output potentials add linearly while the noise adds in quadrature. It should be noted the noise referred to is of a random nature.

Devices made in accordance with this invention may consist of a stacked assembly of PN junctions, each of the order of 4 mils in thickness. The narrowness of the junction is limited primarily by mechanical considerations. It has been found practical to assembly stacks of PN junctions with a density of 250 junctions per linear inch and a width of 0.010 inch × 0.005 inch.

It is a primary object of this invention to provide a light intensity measuring device which provides an intrinsic measurement of light.

It is a further object of this invention to provide a semiconductor light-sensing device providing a voltage output as a true function of the intensity of the illumination.

A different object is to provide a sensitive light-sensing device characterized by a low signal-to-noise ratio.

A further object is to provide a multijunction photodiode which (1) provides an output which is directly proportional to the number of junctions employed; (2) has a signal-to-noise ratio which is improved as the number of junctions are increased; and (3) has an output which is a function of light intensity.

It is another object of this invention to provide a photodiode of small size and high output.

It is a different object of this invention to provide a multijunction photodiode having a voltage output substantially independent of the diode area.

Still a different object of this invention is to provide an improved light-measuring device.

These and other features, objects and advantages of the invention will, in part, be pointed out with particularity and will, in part, become obvious from the following more detailed description of the invention, taken in conjunction with the accompanying drawing which forms an integral part thereof.

BRIEF DESCRIPTION OF THE DRAWING

In the various figures of the drawing, like reference characters designate like parts.

DESCRIPTION OF THE PREFERRED EMBODIMENT

Figure 1:
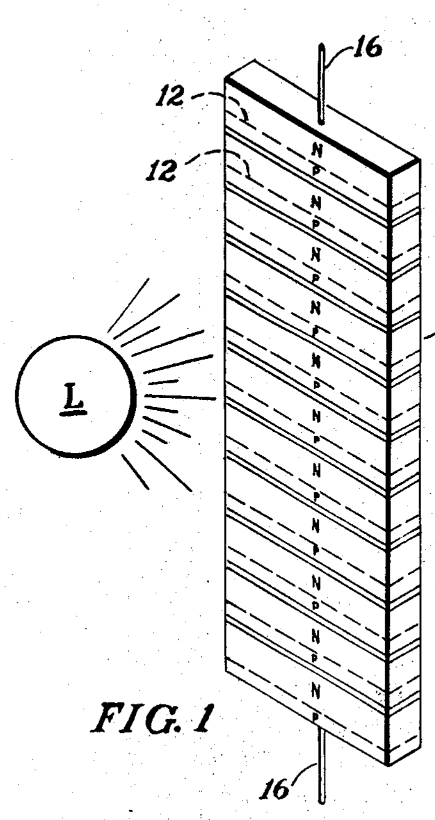
FIG. 1 is a perspective view of a stack of PN junctions forming a photovoltaic device.
Figure 2:
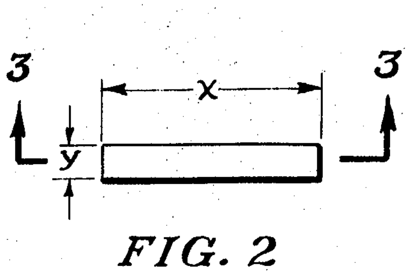
FIG. 2 is a top view of the device of FIG. 1.
Figure 3:
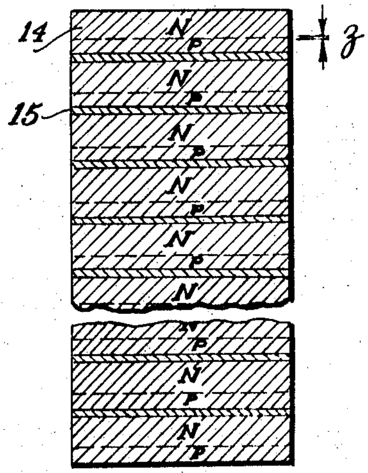
FIG. 3 is a section taken along line 3—3 of FIG. 2.
Figure 4:
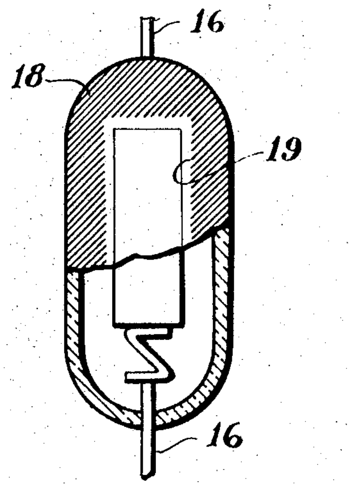
FIG. 4 is a perspective view of the device of FIG. 1 shown in a glass envelope, with the envelope partially broken away.

In Fig. 1 there is shown the photovoltaic generator of this invention comprising a block 10 formed of a plurality of series connected PN junction areas 12 exposed to a source of light L. As seen in the top view of FIG. 2, the cross-sectional area of the junction is XY. In the prior art photovoltaic cell, such as heretofore used for photographic light meters, the light was directed through the top face of the junction, corresponding to the area XY, rather than the edge of the junction as in the present case. On the other hand, as seen in the section of FIG. 3, the Z dimension, the thickness of the PN junction is quite small.

In general, the requisite number of silicon slices 14 containing the PN junctions are stacked together with layers of solder 15 sandwiched therebetween. A weight is placed on the stack which is then heated to melt the solder to cause the silicon slices to bond together. Leads 16 are then attached and the assembly sealed into a suitable housing 18. The housing is opaque except for transparent window 19. The X and Y dimensions need be sufficiently large to provide mechanical integrity and the Y dimension that is the depth dimension extending away from the face of the stack, exposed to the light, should be as small as possible, as it is desirable to maintain as high a ratio between the illuminated area of the junction and the unilluminated area. The unilluminated area of the diode acts as an electrical shunt on the output.

Figure 5:
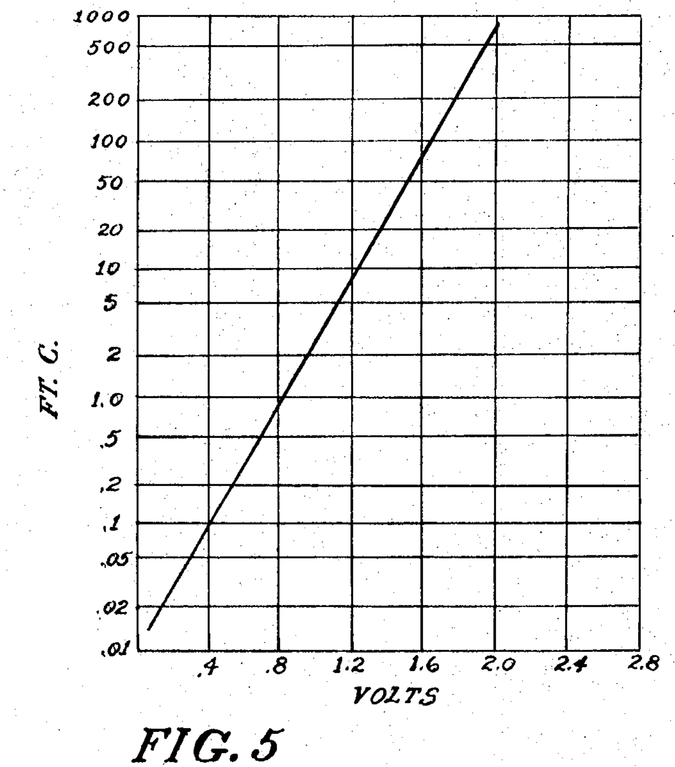
FIG. 5 is a plot showing the output voltage of the device of this invention plotted against the logarithm of light intensity.

In FIG. 5 there is shown the output voltage of the multijunction photodiode of this invention plotted against the logarithm of light intensity. It will be noted that an essentially semilogarithmic response is obtained over the normally used range. The device used in this test contained six PN junctions. An output of over 2 volts was obtained with a light intensity of less than 500 -foot candles.

The multijunction diode is a high-impedance source and provides a negative biased signal. To actuate a conventional low-impedance meter movement, an impedance transformation device would be used. Such devices are within the current state of the art. Operational amplifiers of unity gain may be employed. If has been found that the multijunction diode of this invention, under open circuit conditions, has an output independent of the junction area. This permits the use of extremely small units. For example, the device whose response is shown above is about one-third of the area of the 1/16th by ⅛th inch hole normally used in tabulating cards.

Such devices may be used in any application where it is desired to obtain a voltage output which is a function of the light illuminating the device and where it is desirable to have a much higher output voltage than is obtainable from a single junction.

The photopile 10 may also connected to a voltage responsive device which may be, by way of example, an SCR connected to a utilization means such as a relay to control an external apparatus.

There has been disclosed heretofore the best embodiment of the invention presently contemplated and it is to be understood that various changes and modifications may be made by those skilled in the art without departing from the spirit of the invention.

What we claim as new and desire to secure by Letters Patent is:

1. Apparatus for the detection and measurement of incident light energy comprising:

A plurality of similarly oriented, p-n junctions arranged in series connection in a common stack each p-region, with the exception of one outer p-region, being metallically bonded to an adjacent n-region, said junctions having edges adapted to being exposed to incident light energy;

means, coupled to the outermost p-region and outermost n-region of said stack, for developing a voltage when said junction edges are exposed to incident light energy, said voltage having a signal component and a noise component, said signal component being the linear sum of the signal outputs of each individual junction, said noise component being the quadrature sum of the noise outputs of each individual junction, so that an improved signal-to-noise ratio is effected as the number of junctions is increased, said signal component also being in semilogarithmic relationship with the intensity of incident light; and high-impedance means, responsive to said developed voltage, for sensing the signal component of said developed voltage.

* * * * *